(12) United States Patent
Archer et al.

(10) Patent No.: US 8,578,132 B2
(45) Date of Patent: Nov. 5, 2013

(54) DIRECT INJECTION OF DATA TO BE TRANSFERRED IN A HYBRID COMPUTING ENVIRONMENT

(75) Inventors: Charles J. Archer, Rochester, MN (US); Michael A. Blocksome, Rochester, MN (US); Joseph D. Ratterman, Rochester, MN (US); Gary R. Ricard, Chatfield, MN (US); Brian E. Smith, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 852 days.

(21) Appl. No.: 12/748,559

(22) Filed: Mar. 29, 2010

(65) Prior Publication Data

US 2011/0239003 A1 Sep. 29, 2011

(51) Int. Cl.
*G06F 15/00* (2006.01)
*G06F 15/76* (2006.01)
*G06F 3/00* (2006.01)
*G06F 13/00* (2006.01)
*G06F 15/167* (2006.01)

(52) U.S. Cl.
USPC ............. 712/34; 712/28; 712/29; 712/30; 712/31; 719/313; 709/213

(58) Field of Classification Search
None
See application file for complete search history.

(56) References Cited

U.S. PATENT DOCUMENTS

| | | | |
|---|---|---|---|
| 4,989,131 A | 1/1991 | Stone | |
| 5,073,851 A | 12/1991 | Masterson et al. | |
| 5,363,484 A | 11/1994 | Desnoyers et al. | |
| 5,467,459 A | 11/1995 | Alexander et al. | |
| 5,548,761 A | 8/1996 | Balasundaram et al. | |
| 5,590,345 A | 12/1996 | Barker et al. | |
| 5,613,146 A | 3/1997 | Gove et al. | |
| 5,835,961 A | 11/1998 | Harvey et al. | |
| 5,873,127 A | 2/1999 | Harvey et al. | |
| 5,983,329 A | 11/1999 | Thaler et al. | |
| 6,061,773 A | 5/2000 | Harvey et al. | |
| 6,070,194 A | 5/2000 | Yu et al. | |
| 6,125,430 A | 9/2000 | Noel et al. | |

(Continued)

OTHER PUBLICATIONS

Martellaro, "Using the cell processor as an offload streaming assist for sessionization of network traffic for cross packet inspection", Aug. 2008, pp. 21-24.*

(Continued)

*Primary Examiner* — Andrew Caldwell
*Assistant Examiner* — William B Partridge
(74) *Attorney, Agent, or Firm* — Biggers & Ohanian, LLP (57) ABSTRACT

Direct injection of a data to be transferred in a hybrid computing environment that includes a host computer and a plurality of accelerators, the host computer and the accelerators adapted to one another for data communications by a system level message passing module. Each accelerator includes a Power Processing Element ('PPE') and a plurality of Synergistic Processing Elements ('SPEs'). Direct injection includes reserving, by each SPE, a slot in a shared memory region accessible by the host computer; loading, by each SPE into local memory of the SPE, a portion of data to be transferred to the host computer; executing, by each SPE in parallel, a data processing operation on the portion of the data loaded in local memory of each SPE; and writing, by each SPE, the processed data to the SPE's reserved slot in the shared memory region accessible by the host computer.

16 Claims, 6 Drawing Sheets

(56) References Cited

U.S. PATENT DOCUMENTS

| | | |
|---|---|---|
| 6,266,745 B1 | 7/2001 | De Backer et al. |
| 6,275,857 B1 | 8/2001 | McCartney |
| 6,308,255 B1 | 10/2001 | Gorishek et al. |
| 6,330,659 B1 | 12/2001 | Poff et al. |
| 6,377,979 B1 | 4/2002 | Yamashita et al. |
| 6,473,849 B1 | 10/2002 | Keller et al. |
| 6,556,659 B1 | 4/2003 | Bowman-Amuah |
| 6,598,130 B2 | 7/2003 | Harris et al. |
| 6,651,132 B1 | 11/2003 | Trau |
| 6,658,522 B1 | 12/2003 | Martin et al. |
| 6,848,106 B1 | 1/2005 | Hipp |
| 6,918,070 B1 | 7/2005 | Sharma |
| 6,948,034 B2 | 9/2005 | Aoki |
| 7,383,330 B2 | 6/2008 | Moran et al. |
| 7,418,574 B2 | 8/2008 | Mathur et al. |
| 7,428,573 B2 | 9/2008 | McCanne et al. |
| 7,436,824 B2 | 10/2008 | Pepenella |
| 7,469,273 B2 | 12/2008 | Anderson et al. |
| 7,478,154 B2 | 1/2009 | Cochran et al. |
| 7,631,023 B1 | 12/2009 | Kaiser et al. |
| 7,668,924 B1 | 2/2010 | Young et al. |
| 7,725,905 B1 | 5/2010 | Doshi et al. |
| 7,752,417 B2 | 7/2010 | Manczak et al. |
| 7,814,295 B2 | 10/2010 | Inglett et al. |
| 8,132,106 B2 | 3/2012 | Low et al. |
| 2002/0056033 A1 | 5/2002 | Huppenthal |
| 2002/0108059 A1 | 8/2002 | Canion et al. |
| 2002/0112091 A1 | 8/2002 | Schott et al. |
| 2002/0184217 A1 | 12/2002 | Bisbee et al. |
| 2003/0028751 A1 | 2/2003 | McDonald et al. |
| 2003/0061432 A1 | 3/2003 | Huppenthal et al. |
| 2003/0120723 A1 | 6/2003 | Bright et al. |
| 2003/0226018 A1 | 12/2003 | Tardo et al. |
| 2004/0221127 A1 | 11/2004 | Ang |
| 2005/0273571 A1 | 12/2005 | Lyon et al. |
| 2005/0278680 A1 | 12/2005 | Mukherjee et al. |
| 2006/0018341 A1 | 1/2006 | Pettey et al. |
| 2006/0085789 A1 | 4/2006 | Laborczfalvi et al. |
| 2006/0168435 A1 | 7/2006 | Svensson et al. |
| 2006/0224830 A1 | 10/2006 | Davis et al. |
| 2007/0112999 A1 | 5/2007 | Oney et al. |
| 2007/0113227 A1 | 5/2007 | Oney et al. |
| 2007/0226807 A1 | 9/2007 | Ginter et al. |
| 2007/0255802 A1 | 11/2007 | Aloni et al. |
| 2007/0294505 A1 | 12/2007 | Oney et al. |
| 2008/0028103 A1 | 1/2008 | Schlansker et al. |
| 2008/0091855 A1 | 4/2008 | Moertl et al. |
| 2008/0114937 A1 | 5/2008 | Reid et al. |
| 2008/0183882 A1 | 7/2008 | Flynn et al. |
| 2008/0222396 A1 | 9/2008 | Spracklen et al. |
| 2008/0256330 A1 | 10/2008 | Wang et al. |
| 2008/0259086 A1 | 10/2008 | Doi et al. |
| 2008/0288747 A1 | 11/2008 | Inglett et al. |
| 2009/0024734 A1 | 1/2009 | Merbach et al. |
| 2009/0080428 A1 | 3/2009 | Witkowski et al. |
| 2009/0110326 A1 | 4/2009 | Kim et al. |
| 2009/0276601 A1 | 11/2009 | Kancheria |
| 2010/0036940 A1 | 2/2010 | Carey et al. |
| 2010/0058031 A1 | 3/2010 | Aho et al. |
| 2010/0058356 A1 | 3/2010 | Aho et al. |
| 2010/0064295 A1 | 3/2010 | Aho et al. |
| 2010/0107243 A1 | 4/2010 | Moyer et al. |
| 2010/0153541 A1 | 6/2010 | Arimilli et al. |
| 2010/0191822 A1 | 7/2010 | Archer et al. |
| 2010/0191823 A1 | 7/2010 | Archer et al. |
| 2010/0191917 A1 | 7/2010 | Archer et al. |
| 2010/0191923 A1 | 7/2010 | Archer et al. |

OTHER PUBLICATIONS

Rexford, Jennifer, Bonomi Flavio; Greenberg Albert, Wong Albert, "Scalable Architectures for Integrated Traffic Shaping and Link Scheduling in High-Speed ATM Switches", Jun. 5, 1997, IEEE Journal on Selected Areas in Communications, vol. 15 No. 5, pp. 938-950.
Buonadonna, Phillip, Culler, David, "Queue Pair IP: A Hybrid Architecture for System Area Networks", Aug. 7, 2002. Computer Architecture. 2002. Proceedings. 29th Annual Symposium. pp. 247-256.
Brightwell, Rin, Doerfler, Doug, Underwood D., Keith, "A Preliminary Analysis of the Infiniband and XD1 Network Interfaces", Jun. 26, 2006, Parallel and Distribution Processing Symposium, 2006. IPDPS 2006. 20th International, p. 8.
Martellaro, "Using the cell processor as an offload streaming assist for sessionization of network traffic for cross packet inspector", Aug. 2008, pp. 21-24.
Ball, Stuard, "Introduction to direct memory access", eetimes.com [online], Oct. 14, 2003, [accessed online on Nov. 12, 2010], 3 pages, URL: http://www.eetimes.com/discussion/other/4024879/introduction-to-direct-memory-access.
Office Action, U.S. Appl. No. 12/189,342, mailed Aug. 11, 2008.
Office Action, U.S. Appl. No. 12/204,352, mailed Dec. 16, 2010.
Final Office Action, U.S. Appl. No. 12/189,342, mailed Dec. 23, 2010.
Office Action, U.S. Appl. No. 12/362,137, mailed Nov. 22, 2010.
Office Action, U.S. Appl. No. 12/364,590, mailed Nov. 26, 2010.
Office Action, U.S. Appl. No. 12/361,910, mailed Nov. 19, 2010.
Office Action, U.S. Appl. No. 12/428,646, mailed Feb. 7, 2011.
Notice of Allowance, U.S. Appl. No. 12/204,352, mailed Mar. 14, 2011.
Final Office Action, U.S. Appl. No. 12/362,137, mailed Apr. 25, 2011.
Notice of Allowance, U.S. Appl. No. 12/364,590, mailed Apr. 29, 2011.
Notice of Allowance, U.S. Appl. No. 12/361,910, mailed Apr. 5, 2011.
Office Action, U.S. Appl. No. 12/189,342, mailed Jul. 26, 2011.
Office Action, U.S. Appl. No. 12/204,391, mailed Aug. 17, 2011.
Office Action, U.S. Appl. No. 12/358,663, mailed Oct. 5, 2011.
Office Action, U.S. Appl. No. 12/359,383, mailed Aug. 5, 2011.
Office Action, U.S. Appl. No. 12/361,943, mailed Sep. 21, 2011.
Notice of Allowance, U.S. Appl. No. 12/204,391, mailed Dec. 7, 2011.
Office Action, U.S. Appl. No. 12/360,930, mailed Dec. 29, 2011.
Notice of Allowance, U.S. Appl. No. 12/204,842, mailed Mar. 19, 2012.
Final Office Action, U.S. Appl. No. 12/358,663, mailed Mar. 21, 2012.
Final Office Action, U.S. Appl. No. 12/359,383, mailed Jan. 27, 2012.
Final Office Action, U.S. Appl. No. 12/361,943, mailed Jan. 31, 2012.
Office Action, U.S. Appl. No. 12/360,158, mailed Jan. 19, 2012.
Notice of Allowance, U.S. Appl. No. 12/537,377, mailed Jan. 13, 2012.
Notice of Allowance, U.S. Appl. No. 12/428,646, mailed Jun. 9, 2011.
Office Action, U.S. Appl. No. 12/699,162, mailed Apr. 27, 2012.
Final Office Action, U.S. Appl. No. 12/699,162, mailed Aug. 8, 2012.
Office Action, U.S. Appl. No. 12/360,158, mailed Aug. 6, 2012.
Office Action, U.S. Appl. No. 13/416,636, mailed Sep. 7, 2012.
Office Action, U.S. Appl. No. 13/439,479, mailed Nov. 2, 2012.
Notice of Allowance, U.S. Appl. No. 12/358,663, mailed Jan. 14, 2013.
Office Action, U.S. Appl. No. 12/771,627, mailed Jul. 9, 2012.
Office Action, U.S. Appl. No. 13/664,557, mailed Feb. 1, 2013.

* cited by examiner

DIRECT INJECTION OF DATA TO BE TRANSFERRED IN A HYBRID COMPUTING ENVIRONMENT

BACKGROUND OF THE INVENTION

1. Field of the Invention

The field of the invention is data processing, or, more specifically, methods, apparatus, and products for direct injection of data to be transferred in a hybrid computing environment.

2. Description of Related Art

The development of the Electronic Discrete Variable Automatic Computer (EDVAC) system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

Computer systems today have advanced such that some computing environments now include core components of different architectures which operate together to complete data processing tasks. Such computing environments are described in this specification as 'hybrid' environments, denoting that such environments include host computers and accelerators having different architectures. Although hybrid computing environments are more computationally powerful and efficient in data processing than many non-hybrid computing environments, such hybrid computing environments still present substantial challenges to the science of automated computing machinery.

SUMMARY OF THE INVENTION

Methods, hybrid, and products for direct injection of data to be transferred in a hybrid computing environment, the hybrid computing environment including a host computer having a host computer architecture, a plurality of accelerators having an accelerator architecture, the accelerator architecture optimized, with respect to the host computer architecture, for speed of execution of a particular class of computing functions. The host computer and the accelerators are adapted to one another for data communications by a system level message passing module and each accelerator includes a Power Processing Element ('PPE') and a plurality of Synergistic Processing Elements ('SPEs'). Direct injection in accordance with embodiments of the present invention includes reserving, by each SPE of an accelerator, a slot in a shared memory region accessible by the host computer; loading, by each SPE from local memory of the accelerator into local memory of the SPE, a portion of data to be transferred to the host computer; executing, by each SPE in parallel, a data processing operation on the portion of the data loaded in local memory of each SPE; and writing, by each SPE, the processed data to the SPE's reserved slot in the shared memory region accessible by the host computer.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
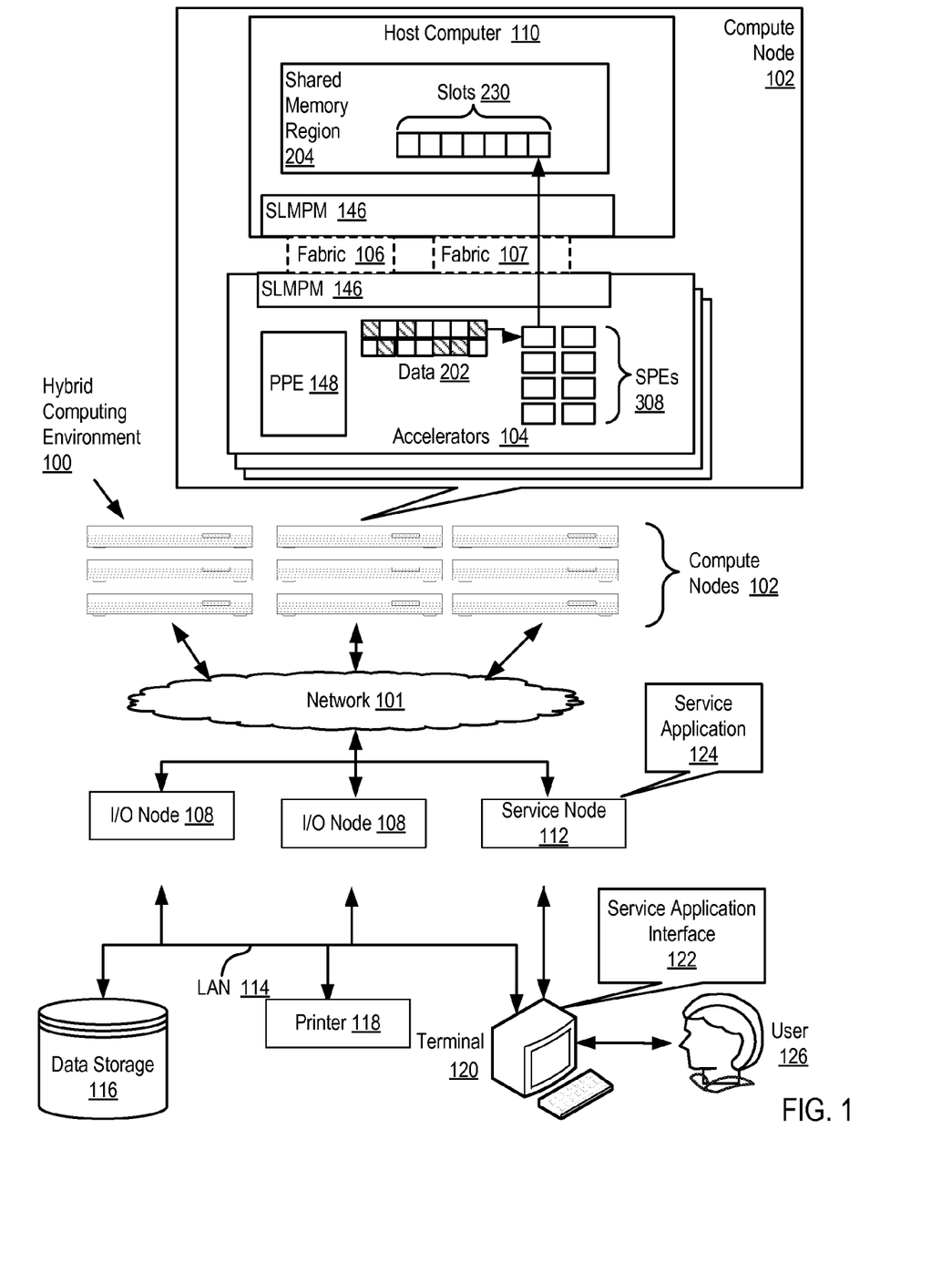
FIG. 1 sets forth a diagram of an example hybrid computing environment useful for direct injection of data to be transferred according to embodiments of the present invention.

Exemplary methods, apparatus, and products for direct injection of data to be transferred in a hybrid computing environment according to embodiments of the present invention are described with reference to the accompanying drawings, beginning with FIG. 1. FIG. 1 sets forth a diagram of an example hybrid computing environment (100) useful for direct injection of data to be transferred according to embodiments of the present invention. A 'hybrid computing environment,' as the term is used in this specification, is a computing environment in that it includes computer processors operatively coupled to computer memory so as to implement data processing in the form of execution of computer program instructions stored in the memory and executed on the processors. In addition, the hybrid computing environment (100) in the example of FIG. 1 includes at least one host computer having a host architecture that operates in cooperation with an accelerator having an accelerator architecture where the host architecture and accelerator architecture are different architectures. The host and accelerator architectures in this example are characterized by architectural registers, registers that are accessible by computer program instructions that execute on each architecture, registers such as, for example, an instruction register, a program counter, memory index registers, stack pointers, and the like. That is, the number, type, structure, and relations among the architectural registers of the two architectures are different, so different that computer program instructions compiled for execution on the host computer of a hybrid computing environment typically cannot be executed natively by any associated accelerator of the hybrid computing environment.

Examples of hybrid computing environments include a data processing system that in turn includes one or more host computers, each having an x86 processor, and accelerators whose architectural registers implement the PowerPC instruction set. Computer program instructions compiled for execution on the x86 processors in the host computers cannot be executed natively by the PowerPC processors in the accelerators. Readers will recognize in addition that some of the example hybrid computing environments described in this specification are based upon the Los Alamos National Laboratory ('LANL') supercomputer architecture developed in the LANL Roadrunner project (named for the state bird of New Mexico), the supercomputer architecture that famously first generated a 'petaflop,' a million billion floating point operations per second. The LANL supercomputer architecture includes many host computers with dual-core AMD Opteron processors coupled to many accelerators with IBM Cell processors, the Opteron processors and the Cell processors having different architectures.

The example hybrid computing environment (100) of FIG. 1 includes a plurality of compute nodes (102), I/O nodes (108), and a service node (112). The compute nodes (102) are coupled through network (101) for data communications with one another and with the I/O nodes (108) and the service node (112). The data communications network (101) may be implemented as an Ethernet, Internet Protocol (In, PCIe, Infiniband, Fibre Channel, or other network as will occur to readers of skill in the art.

In the example hybrid computing environment (100) of FIG. 1, the compute nodes carry out principal user-level computer program execution, accepting administrative services, such as initial program loads and the like, from the service application (124) executing on the service node (112) and gaining access to data storage (116) and I/O functionality (118, 120) through the I/O nodes (108). In the example of FIG. 1, the I/O nodes (108) are connected for data communications to I/O devices (116, 118, 120) through a local area network ('LAN') (114) implemented using high-speed Ethernet or a data communications fabric of another fabric type as will occur to those of skill in the art. I/O devices in the example hybrid computing environment (100) of FIG. 1 include non-volatile memory for the computing environment in the form of data storage device (116), an output device for the hybrid computing environment in the form of printer (118), and a user (126) I/O device in the form of computer terminal (120) that executes a service application interface (122) that provides to a user an interface for configuring compute nodes in the hybrid computing environment and initiating execution by the compute nodes of principal user-level computer program instructions.

In the example of FIG. 1, each compute node includes a host computer (110) having a host computer architecture and one or more accelerators (104) having an accelerator architecture. A host computer (110) is a 'host' in the sense that it is the host computer that carries out interface functions between a compute node and other components of the hybrid computing environment external to any particular compute node. That is, it is the host computer that executes initial boot procedures, power on self tests, basic I/O functions, accepts user-level program loads from service nodes, and so on. An accelerator (104) is an 'accelerator' in that each accelerator has an accelerator architecture that is optimized, with respect to the host computer architecture, for speed of execution of a particular class of computing functions. Such accelerated computing functions include, for example, vector processing, floating point operations, and others as will occur to those of skill in the art.

Because each of the compute nodes in the example of FIG. 1 includes a host computer and an accelerator, readers of skill in the art will recognize that each compute node represents a smaller, separate hybrid computing environment within the larger hybrid computing environment (100) of FIG. 1. That is, not only may the combination of the compute nodes (102) form a hybrid computing environment (100), but it is also the case that each individual compute node may also be viewed as a separate, smaller hybrid computing environment. The hybrid computing environment (100) in the example of FIG. 1 then, may be viewed as composed of nine separate, smaller hybrid computing environments, one for each compute node, which taken together form the hybrid computing environment (100) of FIG. 1.

Within each compute node (102) of FIG. 1, a host computer (110) and one or more accelerators (104) are adapted to one another for data communications by a system level message passing module ('SLMPM') (146) and by two or more data communications fabrics (106, 107) of at least two different fabric types. An SLMPM (146) is a module or library of computer program instructions that exposes an application programming interface ('API') to user-level applications for carrying out message-based data communications between the host computer (110) and the accelerator (104). Examples of message-based data communications libraries that may be improved for use as an SLMPM according to embodiments of the present invention include:

the Message Passing Interface or 'MPI,' an industry standard interface in two versions, first presented at Supercomputing 1994, not sanctioned by any major standards body,
  the Data Communication and Synchronization interface ('DACS') of the LANL supercomputer,
  the POSIX Threads library ('Pthreads'), an IEEE standard for distributed, multithreaded processing,
  the Open Multi-Processing interface ('OpenMP'), an industry-sanctioned specification for parallel programming, and
  other libraries that will occur to those of skill in the art.

A data communications fabric (106, 107) is a configuration of data communications hardware and software that implements a data communications coupling between a host computer and an accelerator. Examples of data communications fabric types include Peripheral Component Interconnect ('PCI'), PCI express ('PCIe'), Ethernet, Infiniband, Fibre Channel, Small Computer System Interface ('SCSI'), External Serial Advanced Technology Attachment ('eSATA'), Universal Serial Bus ('USB'), and so on as will occur to those of skill in the art.

The arrangement of compute nodes, data communications fabrics, networks, I/O devices, service nodes, I/O nodes, and so on, making up the hybrid computing environment (100) as illustrated in FIG. 1 are for explanation only, not for limitation of the present invention. Hybrid computing environments capable of direct injection of data to be transferred according to embodiments of the present invention may include additional nodes, networks, devices, and architectures, not shown in FIG. 1, as will occur to those of skill in the art. Although the hybrid computing environment (100) in the example of FIG. 1 includes only nine compute nodes (102), readers will note that hybrid computing environments according to embodiments of the present invention may include any number of compute nodes. The LANL supercomputer, taken as an example of a hybrid computing environment with multiple compute nodes, contains as of this writing more than 12,000 compute nodes. Networks and data communications fabrics in such hybrid computing environments may support many data communications protocols including for example TCP (Transmission Control Protocol), IP (Internet Protocol), and others as will occur to those of skill in the art. Various embodiments of the present invention may be implemented on a variety of hardware platforms in addition to those illustrated in FIG. 1.

The example hybrid computing environment (100) of FIG. 1 is configured for direct injection of data to be transferred according to embodiments of the present invention. Each accelerator includes a Power Processing Element ('PPE') (148) and a number of Synergistic Processing Elements ('SPEs') (308), described below in detail with respect to FIG. 2 and FIG. 3. The hybrid computing environment (100) of FIG. 1 may carry out direct injection of data (202) to be transferred in accordance with embodiments of the present invention by reserving, by each SPE (308) of an accelerator (104), a slot (230) in a shared memory region (204) accessible by the host computer (110). Each SPE (308) loads, from local memory of the accelerator (104) into local memory of the SPE (308), a portion of data (202) to be transferred to the host computer (110). In the example of FIG. 1, the portions of data (202) to be transferred to the host computer (110) are represented by shaded blocks of the data (202). Each SPE (308) executes, in parallel, a data processing operation on the portion of the data (202) loaded in local memory of each SPE and writes, by each SPE, the processed data to the SPE's reserved slot (230) in the shared memory region (204) accessible by the host computer (110).

Figure 2:
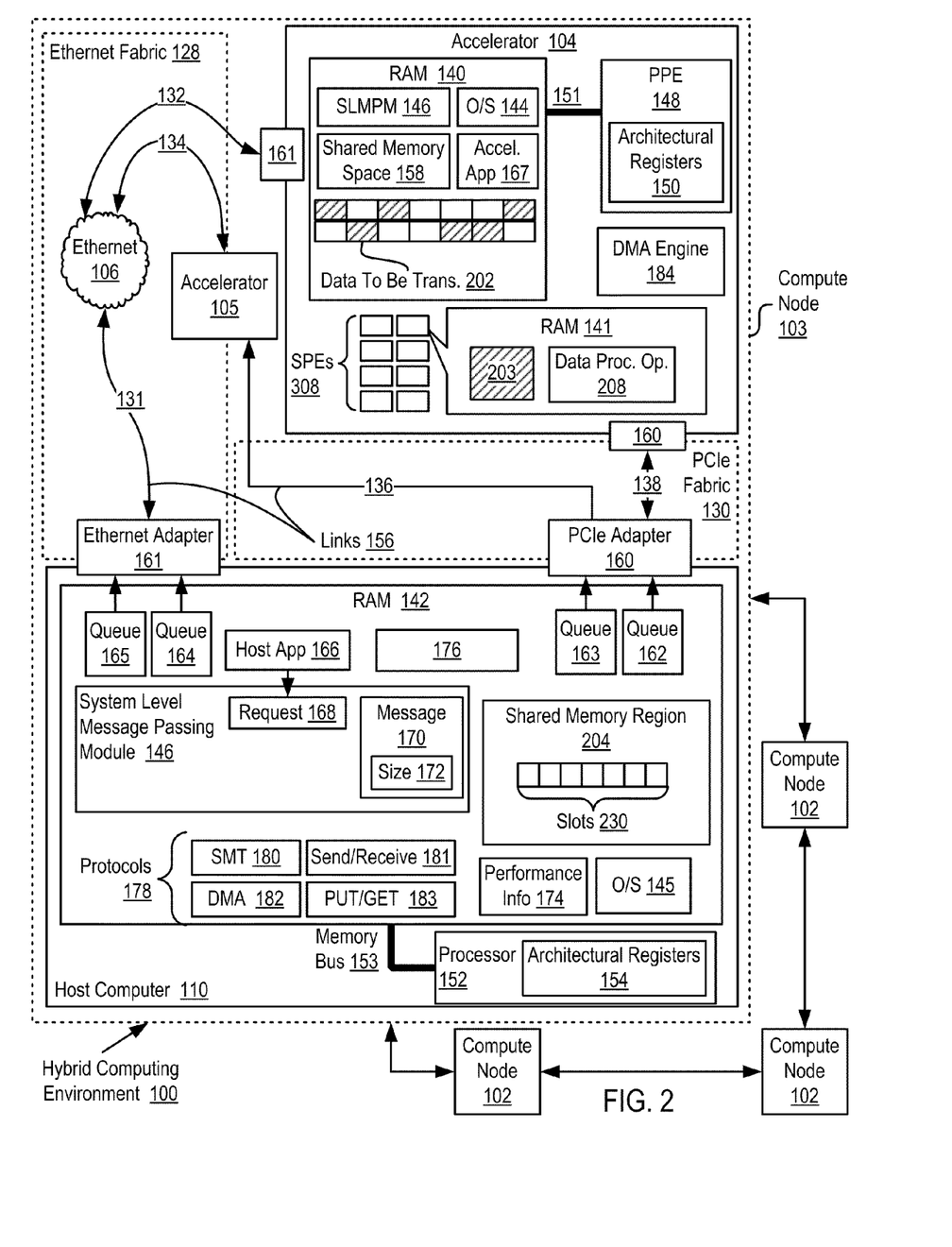
FIG. 2 sets forth a block diagram of an exemplary hybrid computing environment useful for direct injection of data to be transferred according to embodiments of the present invention.

For further explanation, FIG. 2 sets forth a block diagram of an exemplary hybrid computing environment (100) useful for direct injection of data to be transferred according to embodiments of the present invention. The hybrid computing environment (100) of FIG. 2 includes four compute nodes. Similar to the compute nodes of FIG. 1, each of the compute nodes in the example of FIG. 2 may represent a small, separate hybrid computing environment which taken together make up a larger hybrid computing environment. One compute node (103) in the example of FIG. 2 is illustrated in an expanded view to aid a more detailed explanation of such a hybrid computing environment (100). As shown in the expanded view of compute node (103), each of the compute nodes (102, 103) in the example of FIG. 2 includes a host computer (110). The host computer (110) includes a computer processor (152) operatively coupled to computer memory, Random Access Memory ('RAM') (142), through a high speed memory bus (153). The processor (152) in each host computer (110) has a set of architectural registers (154) that defines the host computer architecture.

Each of the compute nodes also includes one or more accelerators (104, 105). Each accelerator (104, 105) includes a computer processor (148) operatively coupled to RAM (140) through a high speed memory bus (151). Stored in RAM (140,142) of the host computer and the accelerators (104, 105) is an operating system (145). Operating systems useful in host computers and accelerators of hybrid computing environments according to embodiments of the present invention include UNIX™, Linux™, Microsoft XP™, Microsoft Vista™, Microsoft NT™, AIX™, IBM's i5/OS™, and others as will occur to those of skill in the art. There is no requirement that the operating system in the host computers should be the same operating system used on the accelerators.

The processor (148) of each accelerator (104, 105) has a set of architectural registers (150) that defines the accelerator architecture. The architectural registers (150) of the processor (148) of each accelerator are different from the architectural registers (154) of the processor (152) in the host computer (110). With differing architectures, it would be uncommon, although possible, for a host computer and an accelerator to support the same instruction sets. As such, computer program instructions compiled for execution on the processor (148) of an accelerator (104) generally would not be expected to execute natively on the processor (152) of the host computer (110) and vice versa. Moreover, because of the typical differences in hardware architectures between host processors and accelerators, computer program instructions compiled for execution on the processor (152) of a host computer (110) generally would not be expected to execute natively on the processor (148) of an accelerator (104) even if the accelerator supported the instruction set of the host. The accelerator architecture in example of FIG. 2 is optimized, with respect to the host computer architecture, for speed of execution of a particular class of computing functions. That is, for the function or functions for which the accelerator is optimized, execution of those functions will proceed faster on the accelerator than if they were executed on the processor of the host computer.

In the example of FIG. 2, the host computer (110) and the accelerators (104, 105) are adapted to one another for data communications by a system level message passing module ('SLMPM') (146) and two data communications fabrics (128, 130) of at least two different fabric types. In this example, to support message-based data communications between the host computer (110) and the accelerator (104), both the host computer (110) and the accelerator (104) have an SLMPM (146) so that message-based communications can both originate and be received on both sides of any coupling for data communications. Also in the example of FIG. 2, the host computer (110) and the accelerators (104, 105) are adapted to one another for data communications by a PCIe fabric (130) through PCIe communications adapters (160) and an Ethernet fabric (128) through Ethernet communications adapters (161). The use of PCIe and Ethernet is for explanation, not for limitation of the invention. Readers of skill in the art will immediately recognize that hybrid computing environments according to embodiments of the present invention may include fabrics of other fabric types such as, for example, PCI, Infiniband, Fibre Channel, SCSI, eSATA, USB, and so on.

The SLMPM (146) in this example operates generally for data processing in a hybrid computing environment (100) by monitoring data communications performance for a plurality of data communications modes between the host computer (110) and the accelerators (104, 105), receiving a request (168) to transmit data according to a data communications mode from the host computer to an accelerator, determining whether to transmit the data according to the requested data communications mode, and if the data is not to be transmitted according to the requested data communications mode: selecting another data communications mode and transmitting the data according to the selected data communications mode. In the example of FIG. 2, the monitored performance is illustrated as monitored performance data (174) stored by the SLMPM (146) in RAM (142) of the host computer (110) during operation of the compute node (103).

A data communications mode specifies a data communications fabric type, a data communications link, and a data communications protocol (178). A data communications link (156) is data communications connection between a host computer and an accelerator. In the example of FIG. 2, a link (156) between the host computer (110) and the accelerator (104) may include the PCIe connection (138) or the Ethernet connection (131, 132) through the Ethernet network (106). A link (156) between the host computer (110) and the accelerator (105) in the example of FIG. 2 may include the PCIe connection (136) or the Ethernet connection (131, 134) through the Ethernet network (106). Although only one link for each fabric type is illustrated between the host computer and the accelerator in the example of FIG. 2, readers of skill in the art will immediately recognize that there may any number of links for each fabric type.

A data communications protocol is a set of standard rules for data representation, signaling, authentication and error detection required to send information from a host computer (110) to an accelerator (104). In the example of FIG. 2, the SLMPM (146) may select one of several protocols (178) for data communications between the host computer (110) and the accelerator. Examples of such protocols (178) include shared memory transfers ('SMT') (180) executed with a send and receive operations (181), and direct memory access ('DMA') (182) executed with PUT and GET operations (183).

Shared memory transfer is a data communications protocol for passing data between a host computer and an accelerator into shared memory space (158) allocated for such a purpose such that only one instance of the data resides in memory at any time. Consider the following as an example shared memory transfer between the host computer (110) and the accelerator (104) of FIG. 2. An application (166) requests (168) a transmission of data (176) from the host computer (110) to the accelerator (104) in accordance with the SMT (180) protocol. Such a request (168) may include a memory address allocated for such shared memory. In this example, the shared memory segment (158) is illustrated in a memory location on the accelerator (104), but readers will recognize that shared memory segments may be located on the accelerator (104), on the host computer (110), on both the host computer and the accelerator, or even off the local compute node (103) entirely—so long as the segment is accessible as needed by the host and the accelerator. To carry out a shared memory transfer, the SLMPM (146) on the host computer (110) establishes a data communications connection with the SLMPM (146) executing on the accelerator (104) by a handshaking procedure similar to that in the TCP protocol. The SLMPM (146) then creates a message (170) that includes a header and a payload data and inserts the message into a message transmit queue for a particular link of a particular fabric. In creating the message, the SLMPM inserts, in the header of the message, an identification of the accelerator and an identification of a process executing on the accelerator. The SLMPM also inserts the memory address from the request (168) into the message, either in the header or as part of the payload data. The SLMPM also inserts the data (176) to be transmitted in the message (170) as part of the message payload data. The message is then transmitted by a communications adapter (160, 161) across a fabric (128, 130) to the SLMPM executing on the accelerator (104) where the SLMPM stores the payload data, the data (176) that was transmitted, in shared memory space (158) in RAM (140) in accordance with the memory address in the message.

Direct memory access ('DMA') is a data communications protocol for passing data between a host computer and an accelerator with reduced operational burden on the computer processor (152). A DMA transfer essentially effects a copy of a block of memory from one location to another, typically from a host computer to an accelerator or vice versa. Either or both a host computer and accelerator may include DMA engine, an aggregation of computer hardware and software for direct memory access. Direct memory access includes reading and writing to memory of accelerators and host computers with reduced operational burden on their processors. A DMA engine of an accelerator, for example, may write to or read from memory allocated for DMA purposes, while the processor of the accelerator executes computer program instructions, or otherwise continues to operate. That is, a computer processor may issue an instruction to execute a DMA transfer, but the DMA engine, not the processor, carries out the transfer.

In the example of FIG. 2, only the accelerator (104) includes a DMA engine (184) while the host computer does not. In this embodiment the processor (152) on the host computer may initiate a DMA transfer of data from the host to the accelerator in one of several ways: by sending a message according to the SMT protocol to the accelerator, instructing the accelerator to perform a remote 'GET' operation, or by direct communications with the DMA engine through the PCIe fabric (130). The configuration illustrated in the example of FIG. 2 in which the accelerator (104) is the only device containing a DMA engine is for explanation only, not for limitation. Readers of skill in the art will immediately recognize that in many embodiments, both a host computer and an accelerator may include a DMA engine, while in yet other embodiments only a host computer includes a DMA engine.

To implement a DMA protocol in the hybrid computing environment of FIG. 2 some memory region is allocated for access by the DMA engine. Allocating such memory may be carried out independently from other accelerators or host computers, or may be initiated by and completed in cooperation with another accelerator or host computer. Shared memory regions, allocated according to the SMA protocol, for example, may be memory regions made available to a DMA engine. That is, the initial setup and implementation of DMA data communications in the hybrid computing environment (100) of FIG. 2 may be carried out, at least in part, through shared memory transfers or another out-of-band data communications protocol, out-of-band with respect to a DMA engine. Allocation of memory to implement DMA transfers is relatively high in latency, but once allocated, the DMA protocol provides for high bandwidth data communications that requires less processor utilization than many other data communications protocols.

A direct 'PUT' operation is a mode of transmitting data from a DMA engine on an origin device to a DMA engine on a target device. A direct 'PUT' operation allows data to be transmitted and stored on the target device with little involvement from the target device's processor. To effect minimal involvement from the target device's processor in the direct 'PUT' operation, the origin DMA engine transfers the data to be stored on the target device along with a specific identification of a storage location on the target device. The origin DMA knows the specific storage location on the target device because the specific storage location for storing the data on the target device has been previously provided by the target DMA engine to the origin DMA engine.

A remote 'GET' operation, sometimes denominated an 'rGET,' is another mode of transmitting data from a DMA engine on an origin device to a DMA engine on a target device. A remote 'GET' operation allows data to be transmitted and stored on the target device with little involvement from the origin device's processor. To effect minimal involvement from the origin device's processor in the remote 'GET' operation, the origin DMA engine stores the data in an storage location accessible by the target DMA engine, notifies the target DMA engine, directly or out-of-band through a shared memory transmission, of the storage location and the size of the data ready to be transmitted, and the target DMA engine retrieves the data from storage location.

Monitoring data communications performance for a plurality of data communications modes may include monitoring a number of requests (168) in a message transmit request queue (162-165) for a data communications link (156). In the example of FIG. 2, each message transmit request queue (162-165) is associated with one particular data communications link (156). Each queue (162-165) includes entries for messages (170) that include data (176) to be transmitted by the communications adapters (160, 161) along a data communications link (156) associated with queue.

Monitoring data communications performance for a plurality of data communications modes may also include monitoring utilization of a shared memory space (158). In the example of FIG. 2, shared memory space (158) is allocated in RAM (140) of the accelerator. Utilization is the proportion of the allocated shared memory space to which data has been stored for sending to a target device and has not yet been read or received by the target device, monitored by tracking the writes and reads to and from the allocated shared memory. In the hybrid computing environment (100) of FIG. 2, shared memory space, any memory in fact, is limited. As such, a shared memory space (158) may be filled during execution of an application program (166) such that transmission of data from the host computer (110) to an accelerator may be slowed, or even stopped, due to space limitations in the shared memory space.

In some embodiments of the present invention, the hybrid computing environment (100) of FIG. 2 may be configured to operate as a parallel computing environment in which two or more instances the application program (166) executes on two or more host computers (110) in the parallel computing environment. In such embodiments, monitoring data communications performance across data communications modes may also include aggregating data communications performance information (174) across a plurality of instances of the application program (166) executing on two or more host computers in a parallel computing environment. The aggregated performance information (174) may be used to calculate average communications latencies for data communications modes, average number of requests in data communications links of a particular fabric type, average shared memory utilization among the plurality of host computers and accelerators in the parallel computing environment, and so on as will occur to those of skill in the art. Any combination of such measures may be used by the SLMPM for both determining whether to transmit the data according to requested data communications mode and selecting another data communications mode for transmitting the data if the data is not to be transmitted according to the requested data communications mode.

The SLMPM (146) of FIG. 2 receives, from an application program (166) on the host computer (110), a request (168) to transmit data (176) according to a data communications mode from the host computer (110) to the accelerator (104). Such data (176) may include computer program instructions compiled for execution by the accelerator (104), work piece data for an application program executing on the accelerator (104), or some combination of computer program instructions and work piece data. Receiving a request (168) to transmit data (176) according to a data communications mode may include receiving a request to transmit data by a specified fabric type, receiving a request to transmit data through a specified data communications link from the host computer to the accelerator, or receiving a request to transmit data from the host computer to the accelerator according to a protocol.

A request (168) to transmit data (176) according to a data communications mode may be implemented as a user-level application function call through an API to the SLMPM (146), a call that expressly specifies a data communications mode according to protocol, fabric type, and link. A request implemented as a function call may specify a protocol according to the operation of the function call itself. A dacs_put( ) function call, for example, may represent a call through an API exposed by an SLMPM implemented as a DACS library to transmit data in the default mode of a DMA 'PUT' operation. Such a call, from the perspective of the calling application and the programmer who wrote the calling application, represents a request to the SLMPM library to transmit data according to the default mode, known to the programmer to be default mode associated with the express API call. The called function, in this example dacs_put( ) may be coded according to embodiments of the present invention, to make its own determination whether to transmit the data according to the requested data communications mode, that is, according to the default mode of the called function. In a further example, a dacs_send( ) instruction may represent a call through an API exposed by an SLMPM implemented as a DACS library to transmit data in the default mode of an SMT 'send' operation, where the called function dacs_send( ) is again coded according to embodiments of the present invention to make its own determination whether to transmit the data according to the requested mode.

An identification of a particular accelerator in a function call may effectively specify a fabric type. Such a function call may include as a call parameters an identification of a particular accelerator. An identification of a particular accelerator by use of a PCIe ID, for example, effectively specifies a PCI fabric type. In another, similar, example, an identification of a particular accelerator by use of a media access control ('MAC') address of an Ethernet adapter effectively specifies the Ethernet fabric type. Instead of implementing the accelerator ID of the function call from an application executing on the host in such a way as to specify a fabric type, the function call may only include a globally unique identification of the particular accelerator as a parameter of the call, thereby specifying only a link from the host computer to the accelerator, not a fabric type. In this case, the function called may implement a default fabric type for use with a particular protocol. If the function called in the SLMPM is configured with PCIe as a default fabric type for use with the DMA protocol, for example, and the SLMPM receives a request to transmit data to the accelerator (104) according to the DMA protocol, a DMA PUT or DMA remote GET operation, the function called explicitly specifies the default fabric type for DMA, the PCIe fabric type.

In hybrid computing environments in which only one link of each fabric type adapts a single host computer to a single accelerator, the identification of a particular accelerator in a parameter of a function call, may also effectively specify a link. In hybrid computing environments where more than one link of each fabric type adapts a host computer and an accelerator, such as two PCIe links connecting the host computer (110) to the accelerator (104), the SLMPM function called may implement a default link for the accelerator identified in the parameter of the function call for the fabric type specified by the identification of the accelerator.

The SLMPM (146) in the example of FIG. 2 also determines, in dependence upon the monitored performance (174), whether to transmit the data (176) according to the requested data communications mode. Determining whether to transmit the data (176) according to the requested data communications mode may include determining whether to transmit data by a requested fabric type, whether to transmit data through a requested data communications link, or whether to transmit data according to a requested protocol.

In hybrid computing environments, where monitoring data communications performance across data communications modes includes monitoring a number of requests in a message transmit request queue (162-165) for a data communications link, determining whether to transmit the data (176) according to the requested data communications mode may be carried out by determining whether the number of requests in the message transmit request queue exceeds a predetermined threshold. In hybrid computing environments, where monitoring data communications performance for a plurality of data communications modes includes monitoring utilization of a shared memory space, determining whether to transmit the data (176) according to the requested data communications mode may be carried out by determining whether the utilization of the shared memory space exceeds a predetermined threshold.

If the data is not to be transmitted according to the requested data communications mode, the SLMPM (146) selects, in dependence upon the monitored performance, another data communications mode for transmitting the data and transmits the data (176) according to the selected data communications mode. Selecting another data communications mode for transmitting the data may include selecting, in dependence upon the monitored performance, another data communications fabric type by which to transmit the data, selecting a data communications link through which to transmit the data, and selecting another data communications protocol. Consider as an example, that the requested data communications mode is a DMA transmission using a PUT operation through link (138) of the PCIe fabric (130) to the accelerator (104). If the monitored data performance (174) indicates that the number of requests in transmit message request queue (162) associated with the link (138) exceeds a predetermined threshold, the SLMPM may select another fabric type, the Ethernet fabric (128), and link (131, 132) through which to transmit the data (176). Also consider that the monitored performance (176) indicates that current utilization of the shared memory space (158) is less than a predetermined threshold while the number of outstanding DMA transmissions in the queue (162) exceeds a predetermined threshold. In such a case, the SLMPM (146) may also select another protocol, such as a shared memory transfer, by which to transmit the data (174).

Selecting, by the SLMPM, another data communications mode for transmitting the data (172) may also include selecting a data communications protocol (178) in dependence upon data communications message size (172). Selecting a data communications protocol (178) in dependence upon data communications message size (172) may be carried out by determining whether a size of a message exceeds a predetermined threshold. For larger messages (170), the DMA protocol may be a preferred protocol as processor utilization in making a DMA transfer of a larger message (170) is typically less than the processor utilization in making a shared memory transfer of a message of the same size.

As mentioned above, the SLMPM may also transmit the data according to the selected data communications mode. Transmit the data according to the selected data communications mode may include transmitting the data by the selected data communications fabric type, transmitting the data through the selected data communications link, or transmitting the data according to the selected protocol. The SLMPM (146) may effect a transmission of the data according to the selected data communications mode by instructing, through a device driver, the communications adapter for the data communications fabric type of the selected data communications mode to transmit the message (170) according to a protocol of the selected data communications mode, where the message includes in a message header, an identification of the accelerator, and in the message payload, the data (176) to be transmitted.

The example hybrid computing environment (100) of FIG. 2 is configured for direct injection of data to be transferred in accordance with embodiments of the present invention. In the example hybrid computing environment (100) of FIG. 1 the accelerator (104) is configured with eight Synergistic Processing Elements ('SPE's) and the processor (148) is a Power Processing Element ('PPE'). In some embodiments, such as those described below with respect to FIG. 3, the PPE is implemented with a POWER architecture core, but such implementation is not a limitation. The PPE may be implemented with any computer processor having a different architecture than that of the host computer's (110) architecture. The PPE typically operates as a primary processor and controller for the SPE's which operate as streamlined co-processors.

In embodiments of the present invention, the SPEs (308) and PPE (148) operate for direct injection of data to be transferred from an accelerator (104) to a host computer (110). The term 'direct injection' is used here to describe a data transfer operation in which, from the prospective of a computer processor, data is written to a remote memory location, as a writes to memory, rather than transmitted via a data communications message. 'Direct injection' also refers to the fact that data is written from local memory of an SPE by the SPE, considered a secondary or co-processor, rather than by the PPE, considered a primary processor of an accelerator.

Direct injection of data to be transferred from an accelerator (104) to a host computer (110) in the example hybrid computing environment (100) of FIG. 2 may be carried out by reserving, by each SPE (308), a slot (230) in a shared memory region (204) accessible by the host computer (110). A 'slot' as the term is used here refers to a segment of a memory within a shared memory region. An SPE may reserve a slot in various ways including, for example, by associating an identifier of the SPE with a slot identifier (such as a memory address) in a descriptor designated for such purpose, by requesting a slot from the SLMPM (146) in embodiments in which the SLMPM maintains slot reservations for the SPEs, through use of atomic operations by the SPEs such as a semaphore, and in other ways as will occur to readers of skill in the art.

Each SPE (308) in the example of FIG. 1 may load, from local memory (140) of the accelerator (104) into local memory of the SPE (141), a portion of data (202) to be transferred to the host computer (101). In the example of FIG. 2, the portions of data to be transferred are depicted as shaded blocks of data. In some embodiments, the local memory of an SPE (141) may be a register with cache-like memory having high write and read speeds.

In some embodiments of the present invention, including that depicted in the example of FIG. 2, data (202) to be transferred to the host computer (110) resides in non-contiguous local memory (140) of the accelerator (104) prior to being loaded into local memory of the SPEs. A one megabyte data piece to be transferred to a host computer for example may stored non-contiguously in the accelerator's (104) local memory (140) in 1 Kilobyte portions (or data chunks).

Loading the data from local memory (140) of the accelerator (104) may be carried out by using memory addresses of the data to be transferred. Such memory address may be provided to the SPEs in various ways in dependence upon the initiation of the direct injection data transfer operation. For example, a direct injection data transfer operation may be initiated by various modules including the instance of the SLMPM (146) executing on the accelerator (104) at the behest of an accelerator application (167). The accelerator application (167) may provide memory addresses of the data (202) to be transferred to the SLMPM. Such memory addresses may be virtual addresses rather than physical addresses. In such an embodiment, the SLMPM (146) may translate the virtual addresses to physical addresses and pass along the physical addresses to the PPE or directly to the SPEs. That is, in some embodiments, the PPE administrates the provision of memory addresses of data to be transferred to the shared memory region (204).

Each SPE (308), upon loading the portions of data into local memory, may execute, a data processing operation on the portion of the data. Such execution may occur in parallel. That is, the eight SPEs (308) in the example hybrid computing environment (100) of FIG. 2 may load portions of the data (202) in local memory and process the data in parallel. Examples of data processing operations which the SPEs (308) may carry out in parallel include an endianness conversion, a checksum operation, a filtering operation carried out according to filtering criteria, encrypting the data to be transferred, and so on.

Each SPE (308) in the example of FIG. 1 may write the processed data to the SPE's reserved slot in the shared memory region accessible by the host computer. An SPE may write the data to a slot by performing a typical processor memory store to the address of the reserved slot. The SLMPM (146) may administer such a write to a remote memory address and transfer the data across a communications fabric, such as the PCIe Fabric (130) or the Ethernet Fabric (128), in accordance with an SMT (180) or DMA (182) data communications protocol (178). From the perspective of the SPE, the transfer includes a write to memory, while the SLMPM (146) administers the transfer across the data communications fabric.

In the example hybrid computing environment (100) of FIG. 2, the reserved slots (230) are a contiguous region of computer memory. When the data (202) is written into slots forming a contiguous region of computer memory, the host computer (110)—the SLMPM (146) or host application (166)—may read the transferred data from the slots using only a starting memory address and a size of the contiguous region of memory forming the slots or a starting and ending memory address of the contiguous region of memory. That is, the data is effectively packed in a form useful for the host computer (110) by the SPEs (308) when written to the slots formed by a contiguous region of memory. Such 'packing' of data may be especially beneficial, when as mentioned above, the portions of data loaded by the SPEs (308), processed, and written to the slots may be non-contiguous blocks of data in memory. In such an embodiment, non-contiguous data is effectively, processed, packed, and provided by the SPEs (308) to the host computer (110).

Although the slots (230) in the example of FIG. 2 are implemented in as contiguous region of memory, such is not a limitation. In other embodiments, the slots may be implemented with non-contiguous regions of computer memory. When the data (202) is written into slots formed by non-contiguous regions of memory, the host computer (110) may read the data from each slot individually and concatenate the data into a useful work piece.

In the example hybrid computing environment (100) of FIG. 2, the speed of transferring data from the accelerator (104) to the host computer (110), when intermediate data processing is required, may be greatly increased with direct injection in accordance with embodiments of the present invention in comparison to typical methods of communication between an accelerator and a host computer. Such typical methods are carried out in large part by the PPE (148) which creates a possible single-point-of-failure for such communication and a communication bottleneck. Direct injection in accordance with embodiments of the present invention augments parallelism in the hybrid computing environment in that the SPEs (308) may load the data in parallel, process the data in parallel, and transferring the data without the PPE in parallel. Increasing parallelism also increases redundancy and bandwidth utilization in data communications.

The hardware, software applications, computers, data communications fabrics, and other components of the computing environment of FIG. 2 are described here for clarity only, not limitation. Other devices, networks, computers, data structures, computer memory, and so on may be implemented in computing environments according to embodiments of the present invention.

Figure 3:
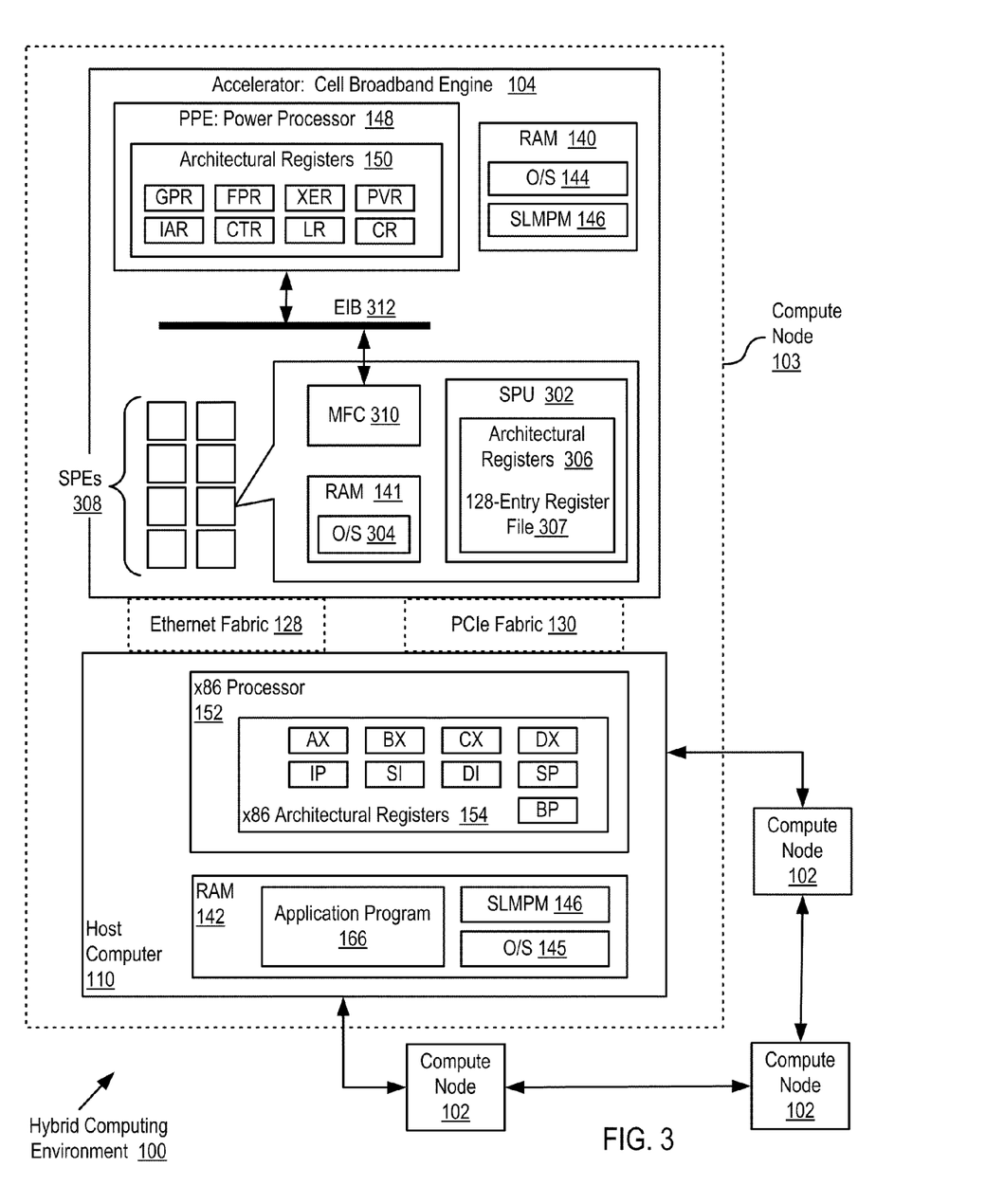
FIG. 3 sets forth a block diagram of a further exemplary hybrid computing environment useful for direct injection of data to be transferred according to embodiments of the present invention.

For further explanation, FIG. 3 sets forth a block diagram of a further exemplary hybrid computing environment (100) useful for direct injection of data to be transferred according to embodiments of the present invention. The hybrid computing environment of FIG. 3 is similar the hybrid computing environment of FIG. 2, including as it does, four compute nodes (102, 103), each of which includes a host computer (110) having a host computer architecture and an accelerator (104) having an accelerator architecture where the accelerator architecture is optimized, with respect to the host computer architecture, for speed of execution of a particular class of computing functions. The host computer (110) and the accelerator (104) are adapted to one another for data communications by a system level message passing module (146) and two or more data communications fabrics (128, 130) of at least two different fabric types. In the example of FIG. 3, the host computer (110) is adapted to accelerator (104) by an Ethernet fabric (128) and a PCIe fabric (130).

The host computer (110) as illustrated in the expanded view of the compute node (103) includes an x86 processor. An x86 processor is a processor whose architecture is based upon the architectural register set of the Intel x86 series of microprocessors, the 386, the 486, the 586 or Pentium™, and so on. Examples of x86 processors include the Advanced Micro Devices ('AMD') Opteron™, the AMD Phenom™, the AMD Athlon XP™, the AMD Athlon 64™, Intel Nehalam™, Intel Pentium 4, Intel Core 2 Duo, Intel Atom, and so on as will occur to those of skill in the art. The x86 processor (152) in the example of Figure illustrates a set of a typical architectural registers (154) found in many x86 processors including, for example, an accumulator register ('AX'), a base register ('BX'), a counter register ('CX'), a data register ('DX'), a source index register for string operations ('SI'), a destination index for string operations ('DI'), a stack pointer ('SP'), a stack base pointer for holding the address of the current stack frame ('BP'), and an instruction pointer that holds the current instruction address ('IP').

The accelerator (104) in the example of FIG. 3 is illustrated as a Cell Broadband Engine ('CBE') having a Cell Broadband Engine Architecture ('CBEA'). A CBEA is a microprocessor architecture jointly developed by Sony Computer Entertainment, Toshiba, and IBM, an alliance known as "STI." Microprocessors implemented according to the CBEA are sometimes referred to as 'Cell' processors or simply as CBEs. The CBEA combines a general-purpose POWER architecture core, a Power Processing Element ('PPE') (148), of modest performance with streamlined co-processing elements, called Synergistic Processing Elements ('SPEs') (308) which greatly accelerate multimedia and vector processing applications, as well as many other forms of dedicated computation. The CBE architecture emphasizes efficiency/watt, prioritizes bandwidth over latency, and favors peak computational throughput over simplicity of program code.

The accelerator (104) of FIG. 3, implemented as a CBE, includes a main processor (148) that in this example is a Power Processing Element ('PPE'), eight fully-functional co-processors called SPEs (308), and a high-bandwidth circular data bus connecting the PPE and the SPEs, called the Element Interconnect Bus ('EIB') (312). The PPE (148) is a POWER architecture processor with a two-way multi-threaded core acting as a controller for the eight SPEs (308). The term "POWER architecture" here refers to IBM's different generations of processor architectures, a broad term including all products based on POWER, PowerPC and Cell architectures. The architectural registers (150) of the PPE (148) of the CBE accelerator (104) therefore are different from those of the x86 processor (152) of the host computer (110). The PPE (148) of FIG. 3 includes an example set of architectural registers (150) of the POWER architecture, including 32 general purpose registers ('GPRs'), 32 floating point registers ('FPRs'), a fixed-point exception register ('XER'), a count register ('CTR'), a Condition register ('CR'), an instruction address register ('IAR'), a link register ('LR'), and a processor version register ('PVR').

The SPEs (308) handle most of the computational workload of the CBE (104). While the SPEs are optimized for vectorized floating point code execution, the SPEs also may execute operating systems, such as, for example, a lightweight, modified version of Linux with the operating system stored in local memory (141) on the SPE. Each SPE (308) in the example of FIG. 3 includes a Synergistic Processing Unit ('SPU') (302), and a Memory Flow Controller ('MFC') (310). An SPU (302) is a Reduced Instruction Set Computing ('RISC') processor with 128-bit single instruction, multiple data ('SIMD') organization for single and double precision instructions. In some implementations, an SPU may contain a 256 KB embedded Static RAM (141) for instructions and data, called local storage which is visible to the PPE (148) and can be addressed directly by software. Each SPU (302) can support up to 4 Gigabyte ('GB') of local store memory. The local store does not operate like a conventional CPU cache because the local store is neither transparent to software nor does it contain hardware structures that predict which data to load. The SPUs (302) also implement architectural registers (306) different from those of the PPE which include a 128-bit, 128-entry register file (307). An SPU (302) can operate on 16 8-bit integers, 8 16-bit integers, 4 32-bit integers, or 4 single precision floating-point numbers in a single clock cycle, as well as execute a memory operation.

The MFC (310) integrates the SPUs (302) in the CBE (104). The MFC (310) provides an SPU with data transfer and synchronization capabilities, and implements the SPU interface to the EIB (312) which serves as the transportation hub for the CBE (104). The MFC (310) also implements the communication interface between the SPE (308) and PPE (148), and serves as a data transfer engine that performs bulk data transfers between the local storage (141) of an SPU (302) and CBE system memory, RAM (140), through DMA. By offloading data transfer from the SPUs (302) onto dedicated data transfer engines, data processing and data transfer proceeds in parallel, supporting advanced programming methods such as software pipelining and double buffering. Providing the ability to perform high performance data transfer asynchronously and in parallel with data processing on the PPE (148) and SPEs (302), the MFC (310) eliminates the need to explicitly interleave data processing and transfer at the application level.

The SLMPM (146) in the example of FIG. 3 processes data in the hybrid computing environment (100) by monitoring data communications performance for a plurality of data communications modes between the host computer (110) and the accelerator (104); receiving, from an application program (166) on the host computer (110), a request to transmit data according to a data communications mode from the host computer (110) to the accelerator (104); determining, in dependence upon the monitored performance, whether to transmit the data according to the requested data communications mode; and if the data is not to be transmitted according to the requested data communications mode: selecting, in dependence upon the monitored performance, another data communications mode for transmitting the data and transmitting the data according to the selected data communications mode.

Figure 4:
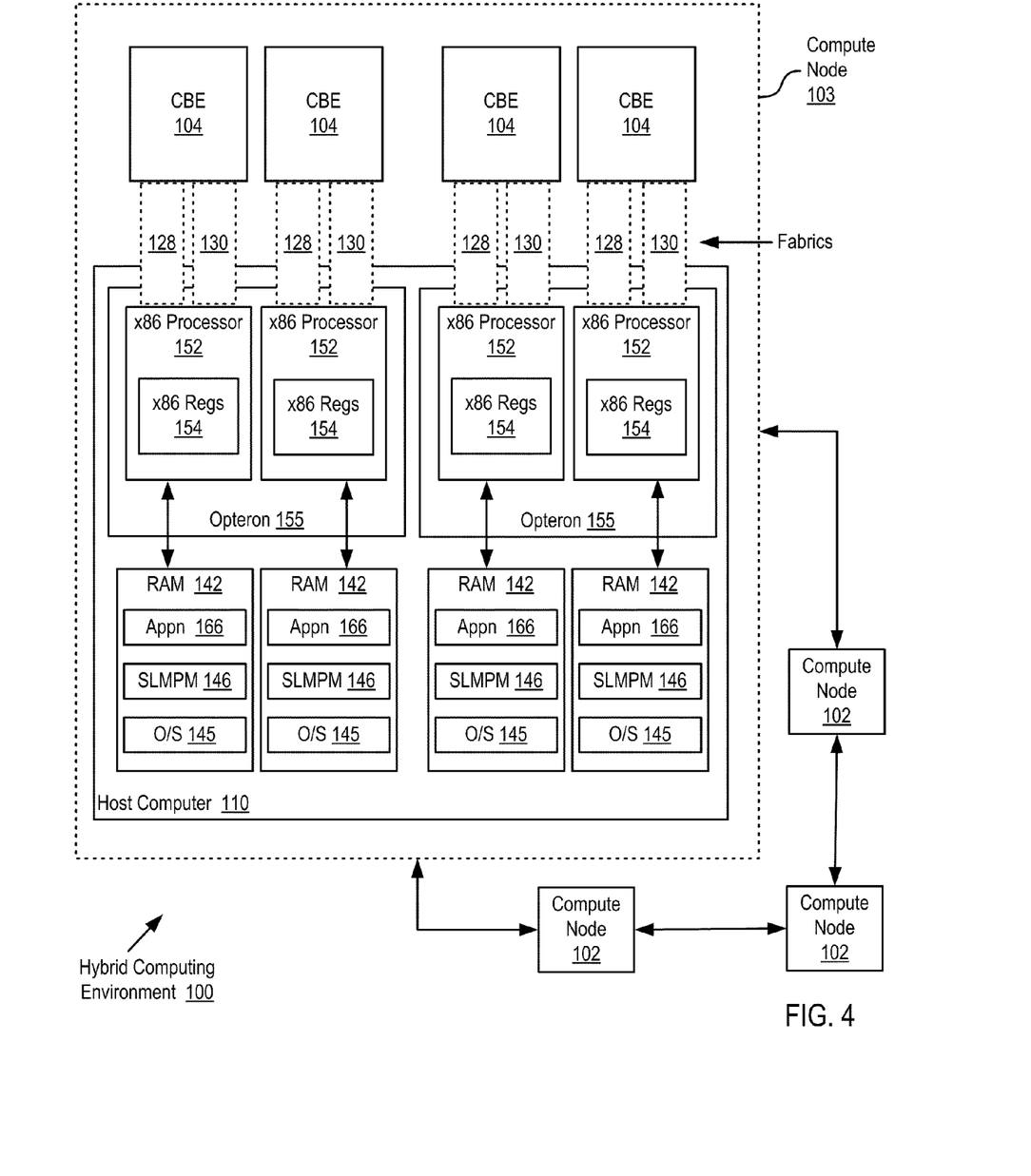
FIG. 4 sets forth a block diagram of a further exemplary hybrid computing environment useful for direct injection of data to be transferred according to embodiments of the present invention.

For further explanation, FIG. 4 sets forth a block diagram of a further exemplary hybrid computing environment (100) useful for direct injection of data to be transferred according to embodiments of the present invention. The hybrid computing environment of FIG. 4 is similar the hybrid computing environment of FIG. 2, including as it does, four compute nodes (102, 103), each of which includes a host computer (110) having a host computer architecture and one or more accelerators (104) each having an accelerator architecture where the accelerator architecture is optimized, with respect to the host computer architecture, for speed of execution of a particular class of computing functions. The host computer (110) and the accelerator (104) in the example of FIG. 4 are adapted to one another for data communications by a system level message passing module (146) and two or more data communications fabrics (128, 130) of at least two different fabric types. In the example of FIG. 4, the host computer (110) is adapted to accelerator (104) by an Ethernet fabric (128) and a PCIe fabric (130).

FIG. 4 illustrates an example of a hybrid computing environment similar to that implemented in the LANL supercomputer. The host computer (110), as illustrated by the expanded view of the compute node (103), implemented in the LANL supercomputer includes two AMD Opteron processors (155), each of which is a dual-core processor. Each of the cores (152) of the host computer (110) is illustrated in the example of FIG. 4 as a single, fully functional x86 processor core with each core having its own set of architectural registers (154). Each of the processor cores (152) in the example of FIG. 4 is operatively coupled to RAM (142) where an instance of an application program (166), an instance of the SLMPM (146), and an operating system (145) is stored. In the example of the LANL supercomputer, the SLMPM (146) is the Data Communication and Synchronization ('DACS') library improved according to embodiments of the present invention.

Each x86 processor core (152) in the example of FIG. 4 is adapted through an Ethernet (128) and PCIe (130) fabric to a separate accelerator (104) implemented as a CBE as described above with respect to FIG. 3. Each core (152) of each AMD Opteron processor (155) in the host computer (110) in this example is connected to at least one CBE. Although in this example the ratio of cores of the Opteron processors to CBEs (104) is one-to-one, readers of skill in the art will recognize that other example embodiments may implement different ratios of processor cores to accelerators such as, for example, one-to-two, one-to-three, and so on.

Each instance of the SLMPM (146) executing on each x86 processor core (152) in the example of FIG. 4 processes data in the hybrid computing environment (100) by monitoring data communications performance across data communications modes between the host computer (110) and the accelerator (104) connected to the processor core (152); receiving, from the instance of the application program (166) executing on the processor core (152) of the host computer (110), a request to transmit data according to a data communications mode from the host computer (110) to the accelerator (104) connected to the processor core (152); determining, in dependence upon the monitored performance, whether to transmit the data according to the requested data communications mode; and if the data is not to be transmitted according to the requested data communications mode: selecting, in dependence upon the monitored performance, another data communications mode for transmitting the data and transmitting the data according to the selected data communications mode.

Figure 5:
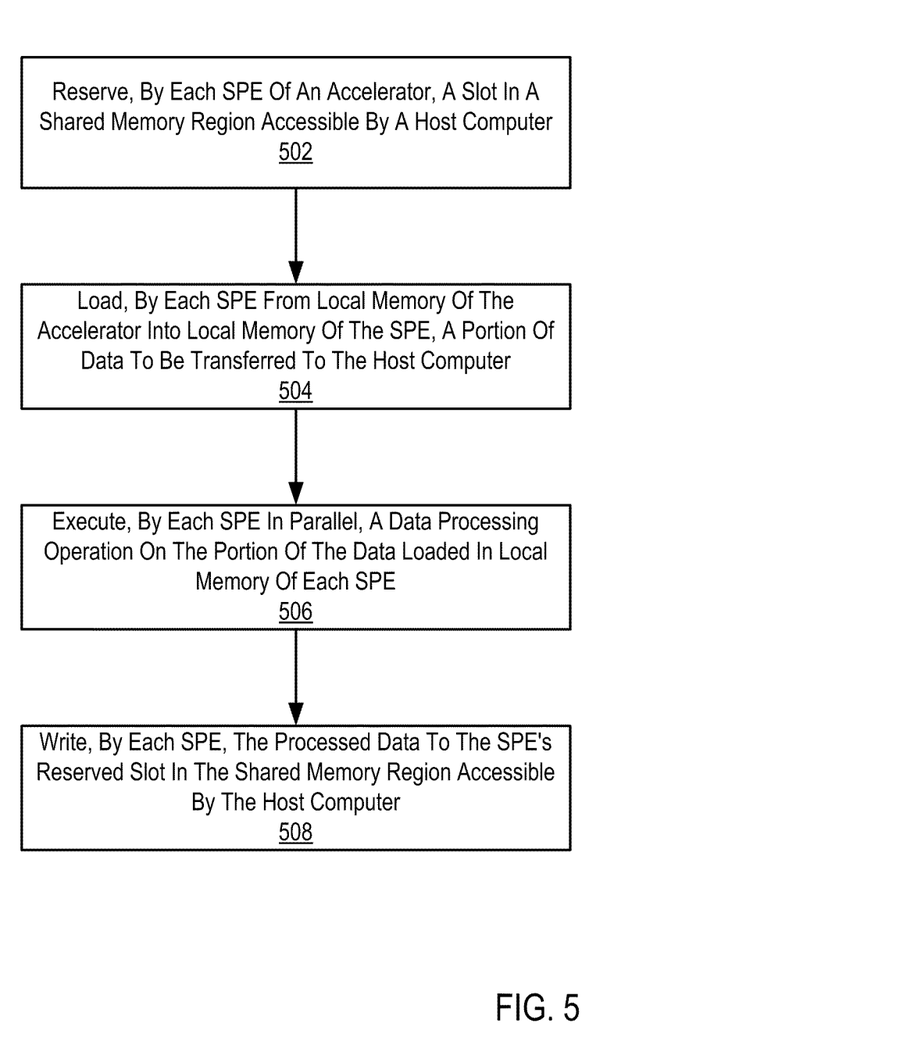
FIG. 5 sets forth a flow chart illustrating an exemplary method for direct injection of data to be transferred in a hybrid computing environment according to embodiments of the present invention.

For further explanation, FIG. 5 sets forth a flow chart illustrating an exemplary method for direct injection of data to be transferred in a hybrid computing environment according to embodiments of the present invention. The method of FIG. 5 is carried out in a computing environment such as for example, the hybrid computing environments described above in this specification. Such a hybrid computing environment (100 in FIG. 2) includes a host computer (110) having a host computer architecture and an accelerator (104) having an accelerator architecture, the accelerator architecture optimized, with respect to the host computer architecture, for speed of execution of a particular class of computing functions, the host computer (110) and the accelerator (104) adapted to one another for data communications by an SLMPM (146) and, optionally, by two or more data communications fabrics (128, 130 on FIG. 2) of at least two different fabric types. In the method of FIG. 5, each accelerator includes a PPE and a number of SPEs.

The method of FIG. 5 includes reserving (502), by each SPE of an accelerator, a slot in a shared memory region accessible by the host computer. An SPE may reserve (502) a slot by registering a memory address corresponding to the slot with an SLMPM or other slot administrator, by associating an SPE identifier with an address of a slot in a data structure designated for slot reservations, or in other ways as will occur to readers of skill in the art. In some embodiments, the reserved slots are formed by a contiguous region of computer memory.

The method of FIG. 5 also includes loading (504), by each SPE from local memory of the accelerator into local memory of the SPE, a portion of data to be transferred to the host computer. The local memory of the SPE may be a register of the SPE with write and read speeds similar to that of cache memory. In some embodiments, the data to be transferred to the host computer resides in non-contiguous local memory of the accelerator prior to being loaded into local memory of the SPEs.

The method of FIG. 5 also includes executing (506), by each SPE in parallel, a data processing operation on the portion of the data loaded in local memory of each SPE. Each SPE may be specialized for such data processing operations. Each SPE may be configured to carry out a different type of data processing operation than other SPEs or all SPEs may be configured to carry out the same data processing operation.

The method of FIG. 5 also includes writing (508), by each SPE, the processed data to the SPE's reserved slot in the shared memory region accessible by the host computer. The SPE may write the data to the reserved slot by executing a write operation using the address of the slot. The SLMPM may carry out the underlying transfer of the data across a communications fabric in accordance with a communications protocol, but from the perspective the SPE, the transfer consists of a write to memory.

Figure 6:
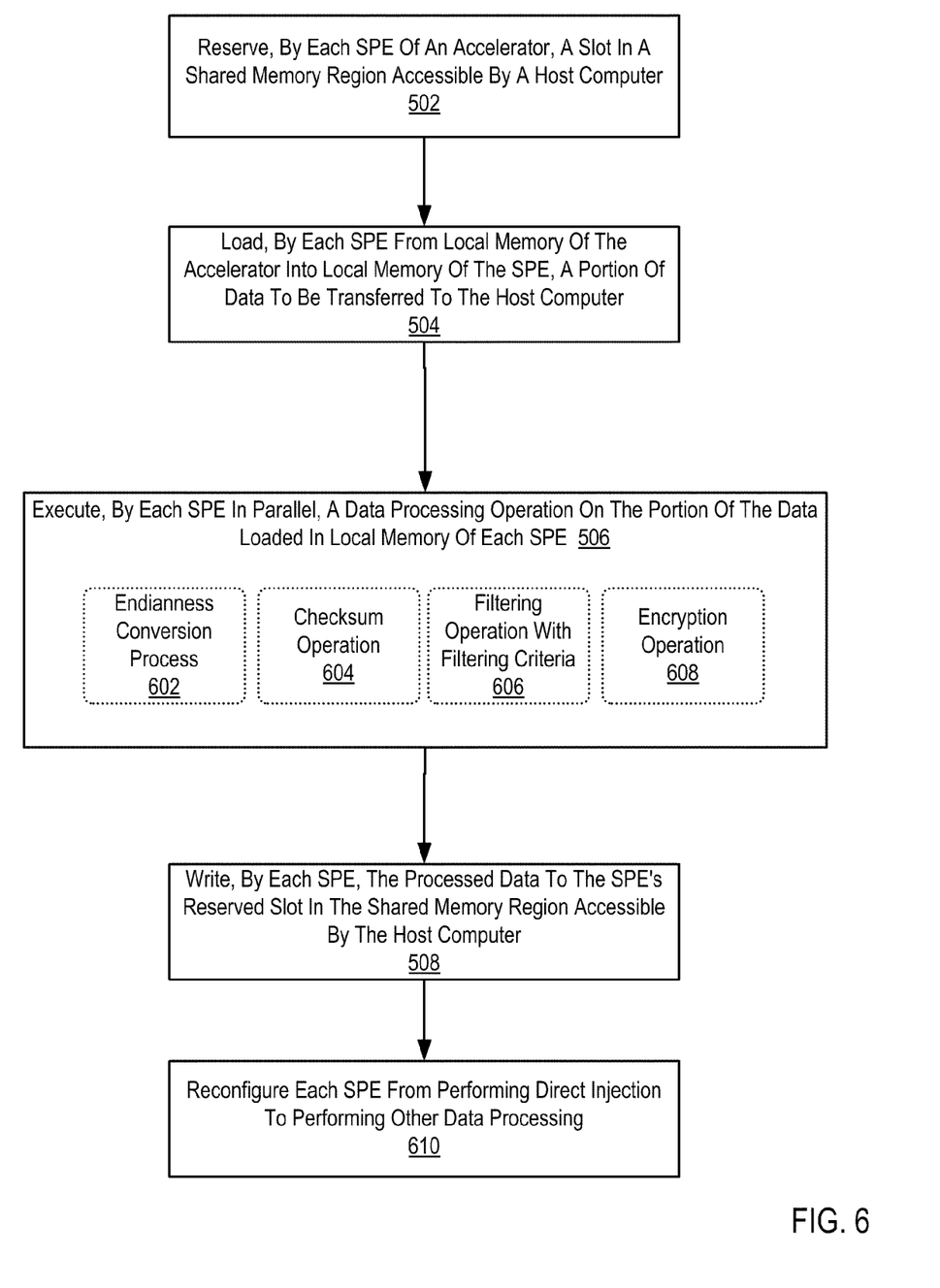
FIG. 6 sets forth a flow chart illustrating a further exemplary method of direct injection of data to be transferred in a hybrid computing environment according to embodiments of the present invention.

For further explanation, FIG. 6 sets forth a flow chart illustrating a further exemplary method of direct injection of data to be transferred in a hybrid computing environment according to embodiments of the present invention. The method of FIG. 6, like the method of FIG. 5 is carried out in a hybrid computing environment similar to the hybrid computing environments described above in this specification. Such a hybrid computing environment (100 in FIG. 2) includes a host computer (110) having a host computer architecture and an accelerator (104) having an accelerator architecture, the accelerator architecture optimized, with respect to the host computer architecture, for speed of execution of a particular class of computing functions, the host computer (110) and the accelerator (104) adapted to one another for data communications by an SLMPM (146) and, optionally, by two or more data communications fabrics (128, 130 on FIG. 2) of at least two different fabric types.

In the method of FIG. 6, each accelerator includes a PPE and a number of SPEs. The method of FIG. 6 is similar to the method of FIG. 5 including, as it reserving (502), by each SPE, a slot; loading (504), by each SPE into local memory of the SPE, a portion of data; executing (506), by each SPE in parallel, a data processing operation; and writing (508), by each SPE, the processed data to the SPE's reserved slot.

The method of FIG. 6 differs from the method of FIG. 5, however, in that in the method of FIG. 5, the data processing operation may be an endianness conversion (602), a checksum operation (604), a filtering operation (606) carried out according to filtering criteria, or an encryption operation (608). The SPEs may process the data according to any or all of these data processing operations (602, 604, 606, 608) in accordance with embodiments of the present invention.

FIG. 6 also includes reconfiguring (610) each SPE from performing direct injection to performing other data processing. Each SPE, when performing direct injection in accordance with embodiments of the present invention, effectively operates as a distinct DMA engine, directly writing data to memory across a data communications fabric. Each SPE however, as described with respect to FIG. 3 may also operate for other data processing. SPEs configured in accordance with embodiments of the present invention may provide the benefit of DMA for time and also perform normal data processing operations at other times.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A hybrid computing environment for direct injection of data to be transferred, the hybrid computing environment comprising a host computer having a host computer architecture, a plurality of accelerators having an accelerator architecture, the accelerator architecture optimized, with respect to the host computer architecture, for speed of execution of a particular class of computing functions, the host computer and the accelerators adapted to one another for data communications by a system level message passing module, each accelerator further comprising a Power Processing Element ('PPE') and a plurality of Synergistic Processing Elements ('SPEs'), the hybrid computing environment comprising computer program instructions capable of:

reserving, by each SPE of an accelerator, a slot in a shared memory region accessible by the host computer;

loading, by each SPE of the accelerator from local memory of the accelerator into local memory of each SPE of the accelerator, a portion of data to be transferred to the host computer;

executing, by each SPE of the accelerator in parallel, a data processing operation on the portion of the data loaded in local memory of each SPE of the accelerator; and writing, by each SPE of the accelerator, the processed data to each SPE of the accelerator' assigned slot in the shared memory region.

2. The hybrid computing environment of claim 1 wherein the reserved slots comprise a contiguous region of computer memory.

3. The hybrid computing environment of claim 1 wherein the data to be transferred to the host computer resides in non-contiguous local memory of the accelerator prior to being loaded into local memory of each SPE of the accelerator.

4. The hybrid computing environment of claim 1 wherein the data processing operation comprises an endianness conversion.

5. The hybrid computing environment of claim 1 wherein the data processing operation comprises a checksum operation.

6. The hybrid computing environment of claim 1 wherein the data processing operation comprises filtering the data to be transferred according to filtering criteria.

7. The hybrid computing environment of claim 1 wherein the data processing operation comprises encrypting the data to be transferred.

8. The hybrid computing environment of claim 1 further comprising computer program instructions capable of reconfiguring each SPE of the accelerator from performing direct injection to performing other data processing.

9. A computer program product for direct injection of data to be transferred in a hybrid computing environment, the hybrid computing environment comprising a host computer having a host computer architecture, a plurality of accelerators having an accelerator architecture, the accelerator architecture optimized, with respect to the host computer architecture, for speed of execution of a particular class of computing functions, the host computer and the accelerators adapted to one another for data communications by a system level message passing module, each accelerator further comprising a Power Processing Element ('PPE') and a plurality of Synergistic Processing Elements ('SPEs'), the computer program product disposed in a computer readable non-transitory medium, the computer program product comprising computer program instructions capable of:

reserving, by each SPE of an accelerator, a slot in a shared memory region accessible by the host computer;

loading, by each SPE of an accelerator from local memory of the accelerator into local memory of each SPE of the accelerator, a portion of data to be transferred to the host computer;

executing, by each SPE of the accelerator in parallel, a data processing operation on the portion of the data loaded in local memory of each SPE of the accelerator; and writing, by each SPE of the accelerator, the processed data to each SPE of the accelerator' assigned slot in the shared memory region.

10. The computer program product of claim 9 wherein the reserved slots comprise a contiguous region of computer memory.

11. The computer program product of claim 9 wherein the data to be transferred to the host computer resides in non-contiguous local memory of the accelerator prior to being loaded into local memory of each SPE of the accelerator.

12. The computer program product of claim 9 wherein the data processing operation comprises an endianness conversion.

13. The computer program product of claim 9 wherein the data processing operation comprises a checksum operation.

14. The computer program product of claim 9 wherein the data processing operation comprises filtering the data to be transferred according to filtering criteria.

15. The computer program product of claim 9 wherein the data processing operation comprises encrypting the data to be transferred.

16. The computer program product of claim 9 further comprising computer program instructions capable of reconfiguring each SPE of the accelerator from performing direct injection to performing other data processing.

* * * * *